(12) United States Patent
Andric et al.

(10) Patent No.: US 6,707,684 B1
(45) Date of Patent: Mar. 16, 2004

(54) METHOD AND APPARATUS FOR DIRECT CONNECTION BETWEEN TWO INTEGRATED CIRCUITS VIA A CONNECTOR

(75) Inventors: Anthony M. Andric, Lockhart, TX (US); Ruel Hill, Austin, TX (US); Doug Markwardt, Cedar Park, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 271 days.

(21) Appl. No.: 09/824,135

(22) Filed: Apr. 2, 2001

(51) Int. Cl.[7] .................................................. H05K 7/10
(52) U.S. Cl. ....................... 361/785; 361/790; 361/803; 257/686; 257/691; 439/69; 438/109
(58) Field of Search ................................ 257/685, 686, 257/691, 723, 777; 361/785, 790, 803; 439/69, 74; 438/109

(56) References Cited

U.S. PATENT DOCUMENTS

| | | | |
|---|---|---|---|
| 4,169,642 A | 10/1979 | Mouissie | |
| 4,417,396 A | 11/1983 | Ammon et al. | ................ 29/884 |
| 4,937,653 A | 6/1990 | Blonder et al. | |
| 4,996,587 A | 2/1991 | Hinrichsmeyer et al. | |
| 5,111,278 A | 5/1992 | Eichelberger | |
| 5,126,920 A | 6/1992 | Cardashian et al. | |
| 5,130,894 A * | 7/1992 | Miller | ......................... 361/735 |
| 5,252,857 A * | 10/1993 | Kane et al. | .................. 257/686 |
| 5,346,402 A * | 9/1994 | Yasuho et al. | ................. 439/71 |
| 5,420,751 A | 5/1995 | Burns | .......................... 361/707 |
| 5,484,959 A | 1/1996 | Burns | .......................... 174/52.4 |
| 5,514,907 A | 5/1996 | Moshayedi | ................... 257/723 |
| 5,556,286 A * | 9/1996 | Ikesugi et al. | ................. 439/74 |
| 5,628,637 A * | 5/1997 | Pecone et al. | ................. 439/74 |
| 5,783,870 A * | 7/1998 | Mostafazadeh et al. | ..... 257/791 |
| 5,829,988 A | 11/1998 | McMillan et al. | ............. 439/70 |
| 5,854,507 A * | 12/1998 | Miremadi et al. | .......... 257/686 |
| 5,885,092 A * | 3/1999 | Ito et al. | ......................... 439/74 |
| 5,917,242 A | 6/1999 | Ball | ............................ 257/737 |
| 5,963,689 A | 10/1999 | Hesselbom | ..................... 385/53 |
| 5,973,340 A | 10/1999 | Mohsen | ........................ 257/209 |
| 5,990,564 A * | 11/1999 | Degani et al. | ............... 257/778 |
| 5,991,161 A * | 11/1999 | Samaras et al. | ............. 361/760 |
| 6,049,467 A * | 4/2000 | Tamarkin et al. | ........... 361/790 |
| 6,078,500 A | 6/2000 | Beaman et al. | ............. 361/704 |
| 6,087,722 A | 7/2000 | Lee et al. | .................... 257/723 |
| 6,091,147 A | 7/2000 | Furuyama | .................... 257/730 |
| 6,109,929 A * | 8/2000 | Jasper | .......................... 439/74 |
| 6,111,756 A | 8/2000 | Moresco | ...................... 361/735 |
| 6,114,986 A | 9/2000 | Cassen et al. | .............. 342/175 |
| 6,153,929 A | 11/2000 | Moden et al. | .............. 257/686 |
| 6,161,215 A | 12/2000 | Hollenbeck et al. | .......... 716/15 |
| 6,206,705 B1 * | 3/2001 | Bolotin et al. | ................ 439/69 |
| 6,327,168 B1 * | 12/2001 | Campbell | ...................... 365/51 |
| 6,339,254 B1 * | 1/2002 | Venkateshwaran et al. | . 257/686 |
| 6,362,974 B1 * | 3/2002 | Lettang | ....................... 361/790 |
| 6,477,593 B1 * | 11/2002 | Khosrowpour et al. | ..... 710/100 |
| 6,574,113 B2 * | 6/2003 | Armezzani et al. | ......... 361/767 |
| 2002/0079568 A1 * | 6/2002 | Degani et al. | .............. 257/686 |
| 2003/0122240 A1 * | 7/2003 | Lin et al. | .................... 257/686 |

\* cited by examiner

*Primary Examiner*—John B. Vigushin
(74) *Attorney, Agent, or Firm*—Zagorin, O'Brien & Graham, LLP

(57) ABSTRACT

A first package for an integrated circuit has both a first set of electrical contacts and a first connector. A second package has a second set of electrical contacts and a second connector. The first and the second connector are mating connectors that are electrically and physically coupled. The first set of electrical contacts and the first connector are disposed on opposite surfaces of the first package and the second set of electrical contacts and the second connector are disposed on the same surface of the second package. The first and second set of electrical contacts couple to a printed circuit board directly or indirectly through a socket. The connectors allow higher speed signals to be routed over the first and second connectors, while power, ground and slower speed signals can be routed over the first set and second set of electrical contacts.

26 Claims, 3 Drawing Sheets

METHOD AND APPARATUS FOR DIRECT CONNECTION BETWEEN TWO INTEGRATED CIRCUITS VIA A CONNECTOR

BACKGROUND OF THE INVENTION

1. Field of the Invention

This invention relates generally to integrated circuits and more particularly to high speed direct connection between integrated circuits.

2. Description of the Related Art

In electronic devices such as personal computers, an integrated circuit such as the microprocessor, typically communicates with other integrated circuits via buses, which are formed physically as traces in a printed circuit board (PCB). Most integrated circuits (ICs) are packaged in plastic or ceramic packages or are otherwise encapsulated to protect the device. Pins or other contacts connect the package to the printed circuit board. There are a wide variety of packages and packaging techniques used for integrated circuits including dual inline packages (DIP), pin grid array (PGA) packages, land grid array (LGA) packages, and ball grid array (BGA) packages. DIPs provide two rows of connectors on the periphery of the package. PGA packages provide an array of pins on the bottom surface of the package. The LGA package provides an array of lands while the BGA package uses an array of solder balls or bumps as the electrical contacts. Chip scale packages are similar to BGA packages, except that chip scale packaging provides a smaller footprint that more closely approximates the footprint of the semiconductor die itself.

The electrical contacts on the various packages may be soldered directly to the printed circuit board or otherwise coupled to the PCB through, e.g., an intermediate device such as a socket. For example, a pin grid array package with a mounted IC die has pins projecting from the package that can be inserted in a zero insertion force (ZIF) socket, which itself is mounted on the printed circuit board. Utilizing sockets such as ZIF sockets allows for the integrated circuit to be easily inserted and removed.

In personal computer (PC) systems, the processor is commonly mounted in a socket that is itself soldered to the PCB. In a typical PC system, the processor and its associated chipset are packaged in separate plastic or ceramic packages and are interconnected through the motherboard or another printed circuit board such as a daughter card. The processor in typical PC configurations communicates with one chip of a chipset (known as the northbridge in the industry) that supports the microprocessor. The northbridge provides memory control as well as system bus control for the computer system and communicates with the processor over a local bus. As clock speeds have increased for the processor, now commonly over 1 GHz, bus speed for the local bus (and other buses) and have also increased. The noise and impedance effects that result from routing a bus through the printed circuit board are to particularly acute for high speed buses, especially where relatively long traces (e.g., over three inches) have to be used for the communication path.

Multi-chip module (MCM) technology can be used where speed or electrical noise considerations require a shorter communication path or applications where it is necessary to minimize size such as in a mobile device. A typical MCM package combines a number of individual integrated circuit dies, which are attached to a mounting surface such as a ceramic substrate. The integrated circuits within an MCM can be electrically connected using a variety of bonding techniques such as solder, wire bonding, tape automated bonding (TAB), and flip-chip technologies. Thus, MCMs can provide an alternative to routing high speed connections on a printed circuit board such as a motherboard of a computer system. However, such MCM technology is costly and therefore undesirable for applications such as desktop personal computers.

Accordingly, it would be desirable to provide high speed connections between ICs without having to route the communication path through the PCB and without having to resort to a relatively costly MCM solution.

SUMMARY OF THE INVENTION

Accordingly, in one embodiment the invention provides an apparatus that includes a first integrated circuit mounted in a first package that has both a first set of electrical contacts and a first connector. A second integrated circuit is mounted in a second package that has a second set of electrical contacts and a second connector. The first and the second connectors are mating connectors that are electrically and physically connected.

In one embodiment the first set of electrical contacts and the first connector are disposed on opposite surfaces of the first package and the second set of electrical contacts and the second connector are disposed on the same surface of the second package. Providing the connectors allows higher speed signals to be routed through the first and second connectors, while power, ground and slower speed signals can be transmitted through the first set and second set of electrical contacts. The first and second set of electrical contacts are on the side of the package closest to the printed circuit board to which the packages are directly or indirectly mounted.

In another embodiment a method is provided that includes electrically coupling a first integrated circuit mounted in a first package through a first set of electrical connectors to a printed circuit board; and electrically connecting the first integrated circuit through a first package connector to a second integrated circuit mounted in a second package having a second package connector, wherein the first and second package connectors are mating connectors.

BRIEF DESCRIPTION OF THE DRAWINGS

The present invention may be better understood, and its numerous objects, features, and advantages made apparent to those skilled in the art by referencing the accompanying drawings.

Note that the use of the same reference symbols in different drawings indicates similar or identical items.

DESCRIPTION OF THE PREFERRED EMBODIMENT(S)

Figure 1:
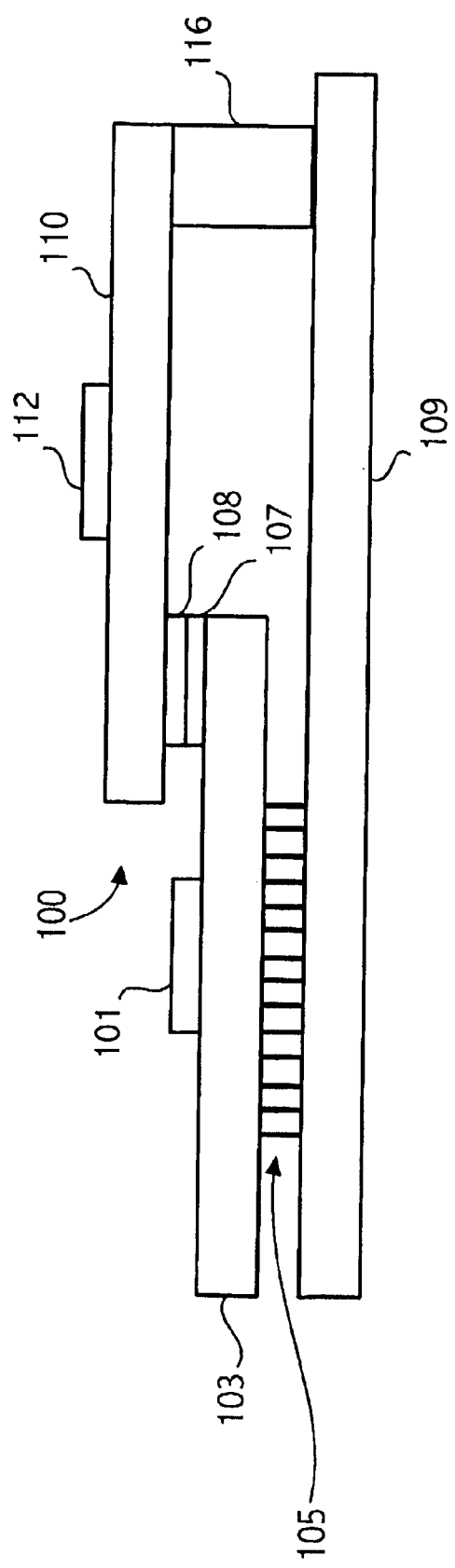
FIG. 1 illustrates an embodiment of the invention in which two integrated circuits are directly coupled through a connector.

Referring to FIG. 1, an exemplary embodiment shows an integrated circuit assembly that includes integrated circuit die 101 mounted on package 103. Package 103 includes two sets of electrical connections. One set of electrical connections is shown as contacts 105 on the bottom surface of package 103. In the illustrated embodiment, contacts 105 electrically connect with printed circuit board 109. In another embodiment, the contacts 105 may connect to printed circuit board 109 through an intermediate device such as a socket. A high density/high speed electrical connector 107 provides a second set of electrical connections on the top surface of package 103.

Also shown in FIG. 1 is package 110 on which is mounted integrated circuit die 112. Package 110 also includes two sets of electrical connections, a mating high speed connector 108 that couples to connector 107 and a set of electrical contacts (not shown in FIG. 1) that connect to circuit board 109 through an intermediate connection (such as a socket) 116. The connectors 107 and 108 allow packages 103 and 110 to be directly connected and preferably the connectors are both high speed and high density connectors. The high density aspect of the connector is desirable due to the limited space that may be available on the package surface on which to locate the connector.

The package 103 may be designed as a ball grid array (BGA) package, in which case the electrical connections 105 generally shown as pins in FIG. 1 would be BGA contacts, i.e., solder balls. The package 103 may also be designed to have any other type of electrical contact on its bottom surface that is suitable for its particular application. For instance, the package 103 may be implemented as a land grid array (LGA), pin grid array (PGA), a chip scale package or other package type suitable for the number of input/output (I/O) connections of the device and the product application.

While the package 103 is implemented as a standard package on one side, package 103 also has the connector 107 on the top surface of package 103. In one embodiment, connector 107 is utilized for high speed signals. Rather than routing the high speed signals through the printed circuit board 109, the high speed signals can be routed directly to another integrated circuit.

A variety of connectors are known in the art and suitable for use as connectors 107 and 108. For example, the connectors may be male/female type of mating connectors. The connectors can include, e.g., lands, or pins and through holes. The connectors may be press fit, snapped together, soldered, or kept engaged with an external compression force. In one embodiment, a connector may be formed of an organic material (FR4) around caulk with wires mounted thereto. Connectors formed of an organic material may be particularly suitable for packages formed of an organic material. The connectors may be attached to pins, pads, lands, or other suitable electrical contacts on the package. The connectors may be screwed, clamped, soldered or otherwise coupled to the package to ensure an appropriate electrical connection is formed between the package contacts and the connector.

In a preferred embodiment, the connectors 107 and 108 support high speed data rates (e.g. >100 MHz) although in some implementations, high speed rates may be unnecessary. In addition, in a preferred embodiment, the connector is high density having less than 0.1 inch centers. The high density connector is advantageous in applications where it is useful to connect a large number of signals between chips without routing the signals through the printed circuit board. In other embodiments, where fewer signals need to be connected directly between chips, a high density connector may be unnecessary.

The integrated circuit package 110 is formed to connect through its connector 108 to package 103. Package 110 has the second set of contacts (not shown in FIG. 1) that connect to printed circuit board 109 through an intermediate connector 116. In one embodiment, the second set of electrical contacts on the bottom surface of package 110 are pins and the intermediate connector 116 is a socket such as a ZIF socket. In the package shown in FIG. 1, the pins (or other electrical contacts such as solder balls, lands, etc.) are located on one side of the bottom surface of package 110 and connector 108 is located on the other side of the bottom surface.

Figure 2:
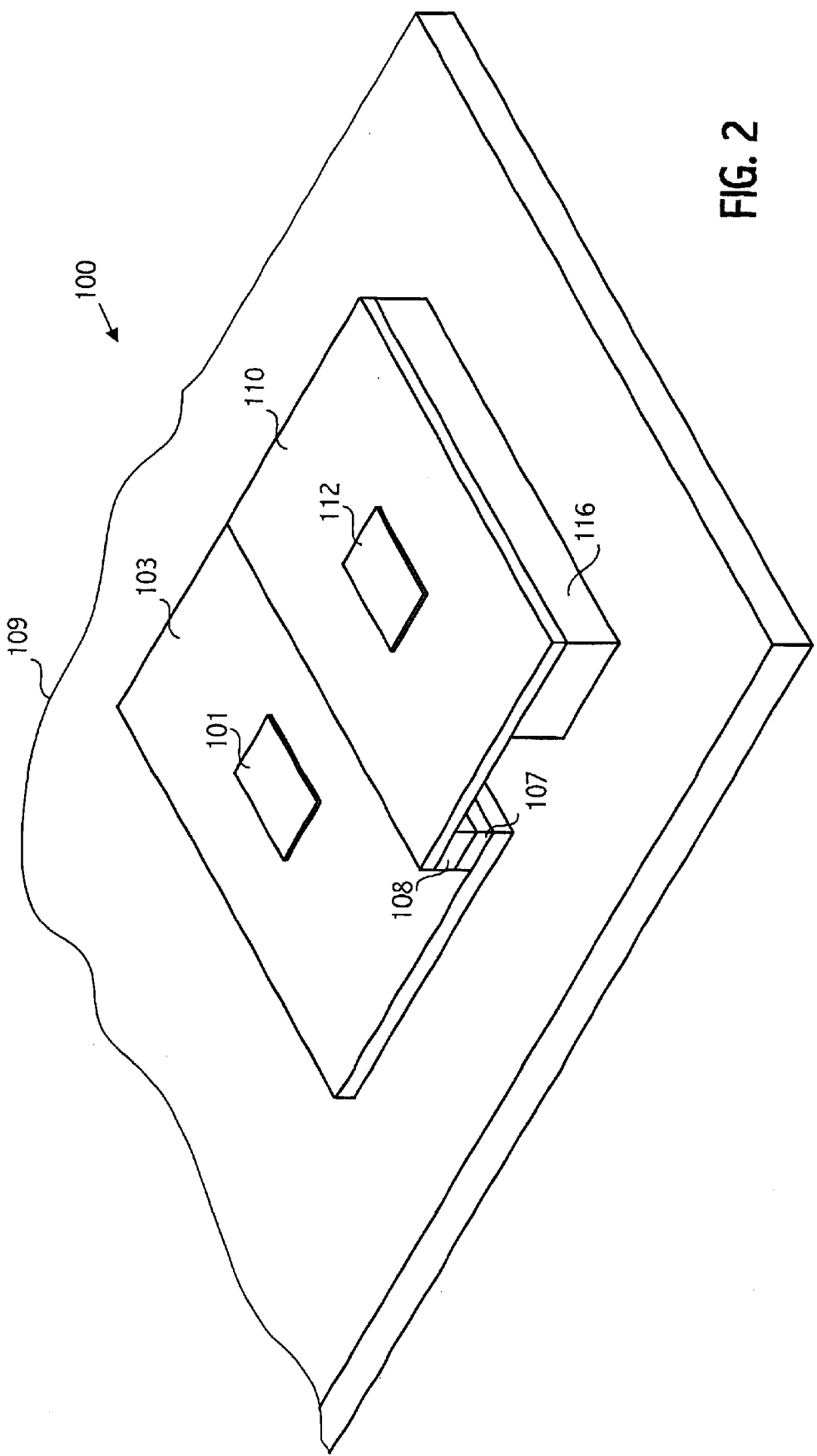
FIG. 2 illustrates an isometric view of directly coupled integrated circuits.

An isometric view of the integrated circuit assembly is shown in FIG. 2. The integrated circuit assembly shown in FIG. 2 may be particularly useful for a personal computer system. As previously described, in a conventional PC environment, a high speed connection is required from the processor integrated circuit to the northbridge. In order to take advantage of a preferred embodiment described herein, the northbridge may be designed as a regular ball grid array (BGA) package 103 but include a high density/high speed connector 107 on the top side of the package 103 as shown in FIG. 2. Thus, integrated circuit die 101 mounted in package 103 functions as the northbridge. Integrated circuit die 112 mounted on package 110 is the processor. The processor has regular pins on one side of the bottom surface of package 110 (i.e., the surface that faces the printed circuit board) for power, ground and slower signals, but also has the mate for the connector that is disposed on top of the north bridge package. A high speed communication link between the processor and the northbridge is provided by the connectors 107 and 108. When installed the processor plugs both into a PGA socket (or other socket appropriate for the electrical contacts formed on the bottom surface of package) that carries power, ground, and slower signals and the northbridge package.

As discussed previously, bus speed are approaching the point where the three or more inch traces common on boards today are problematic for high speed bus signals, particularly on low cost boards utilized in many personal computers and other electronic equipment. Using high speed connectors 107 and 108 avoids routing high speed signals through the printed circuit board and is significantly less expensive when compared to a conventional multi-chip module (MCM) approach. In addition, since the connectors 107 and 108 can be standardized, a processor can be supported by multiple northbridge chips and conversely, a northbridge chip could support more than one processor (as long as the bus was standard). In contrast, an approach using a multi-chip module would be much less flexible.

Figure 3:
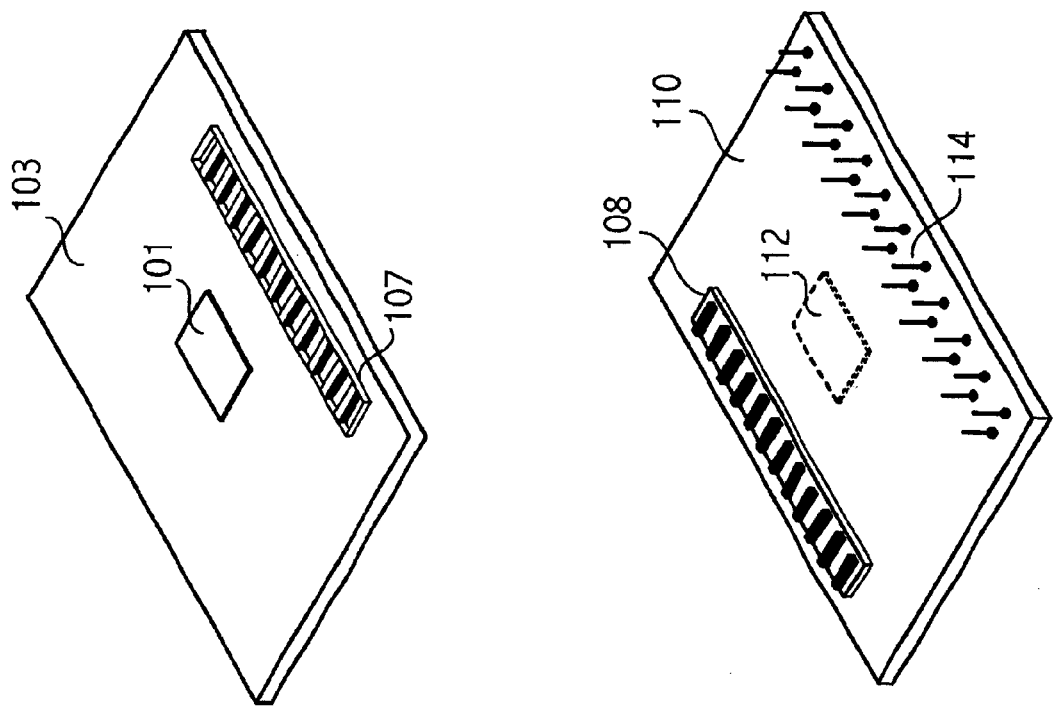
FIG. 3 illustrates in greater detail exemplary packages with connectors utilized in the present invention.

Referring to FIG. 3, another view of an embodiment of the invention is shown illustrating one embodiment of the connectors in greater detail. FIG. 3 also illustrates an embodiment of the second set of electrical contacts 114 on the bottom side of package 110, which are shown as pins. In the embodiment illustrated in FIG. 3, connector 107 is implemented as the female portion and connector 108 is implemented as the male portion of the mating connectors. The illustrated connectors slidably couple together and may provide, e.g., a pluggable press fit connection. Using those types of connectors provides several advantages. One advantage is that assembly is simpler and cheaper since no soldering is required. A second advantage is that the chip on top is removable. Thus, when the embodiment shown in FIGS. 2 and 3 is used in a PC application, the processor package 110 is pluggable into both the north bridge package 103 and the socket 116 (ZIF or another type) and can be removed without having to disconnect soldered connections. In other embodiments, the connectors may be soldered together or electrically connected in another manner suitable for the packaging materials and technology and the application.

Thus, a package for an integrated circuit has been described that provides a high speed connector in addition to conventional electrical contacts. The description of the invention set forth herein is illustrative, and is not intended to limit the scope of the invention as set forth in the following claims. For instance, while the description has focused on advantages when utilized in the PC environment, the invention described herein can be advantageously used in many types of electronic products requiring high speed connections between packaged integrated circuits. Variations and modifications of the embodiments disclosed herein, may be made based on the description set forth herein, without departing from the scope and spirit of the invention as set forth in the following claims.

What is claimed is:

1. An apparatus comprising:
    a first integrated circuit mounted in a first package, the first package having a first set of electrical contacts and a first connector;
    a second integrated circuit mounted in a second package, the second package having a second set of electrical contacts and a second connector, the second connector being electrically and physically coupled to the first connector, the first and second connectors being mating connectors; and
    wherein high speed signals are routed over the first and second connectors and power, ground and slower speed signals are routed over the first set of electrical contacts.

2. The apparatus as recited in claim 1 wherein the first set of electrical contacts are disposed on a first surface of the package and the first connector is disposed on a second surface of the package.

3. The apparatus as recited in claim 2 wherein the second set of electrical contacts and the second connector are disposed on a same surface of the second package.

4. The apparatus as recited in claim 3 wherein the second set of electrical contacts are coupled to a printed circuit board through an intermediate connector.

5. The apparatus as recited in claim 4 wherein the intermediate connector is a socket.

6. The apparatus as recited in claim 1 wherein the first and second connectors are male/female connectors.

7. The apparatus as recited in claim 1 wherein the first and second mating connectors are electrically coupled via press fit connections.

8. The apparatus as recited in claim 1 wherein the first and second connectors are removably coupled.

9. The apparatus as recited in claim 1 wherein power, ground and slower speed signals are routed over the second set of electrical contacts.

10. The apparatus as recited in claim 1 wherein one of the first and second integrated circuits is a microprocessor.

11. The apparatus as recited in claim 1 wherein the first set of electrical contacts are formed by one of solder balls, lands, pins, and wires.

12. The apparatus as recited in claim 1 wherein the first and second connectors carry signals for a standard microprocessor interface between the first and second integrated circuits.

13. The apparatus as recited in claim 1 wherein the first and second connectors are slidably engaged.

14. A method comprising:
    electrically coupling a first integrated circuit mounted in a first package through a first set of electrical connectors to a printed circuit board;
    electrically connecting the first integrated circuit through a first package connector to a second integrated circuit mounted in a second package having a second package connector, wherein the first and second package connectors are mating connectors; and
    sending high speed signals over the first package connector and sending lower speed signals over the first set of electrical connectors.

15. The method as recited in claim 14 wherein the second package is electrically coupled to the printed circuit board.

16. The method as recited in claim 14 wherein the first and second package connectors arc slidably engaged.

17. The method as recited in claim 14 wherein the second package connector is electrically coupled to the first package connector via a solderless connection.

18. An integrated circuit assembly comprising:
    first means for electrically coupling a packaged integrated circuit to a printed circuit board;
    second means for directly electrically coupling the packaged integrated circuit to a second packaged integrated circuit without coupling through the printed circuit board; and
    wherein high speed signals are routed over the second means and wherein power, ground and slower speed signals arm routed over the first means.

19. The integrated circuit assembly as recited in claim 18 wherein the first and second means are located respectively on a first and second surface of the packaged integrated circuit.

20. The integrated circuit assembly as recited in claim 18 wherein the second means for directly electrically coupling couples standard interface signals between the first and second packaged integrated circuit.

21. An integrated circuit assembly comprising:
    first means for electrically coupling a packaged integrated circuit to a printed circuit board;
    second means for directly electrically coupling the packaged integrated circuit to a second packaged integrated circuit without coupling through the printed circuit board; and
    wherein the first and second means are located on a first surface of the packaged integrated circuit.

22. A package assembly including an integrated circuit package for an integrated circuit die, comprising:
    a first set of electrical contacts for coupling to a printed circuit board;
    a connector disposed on a surface of the package for coupling to a mating connector on another integrated circuit package; and
    wherein high speed signals are routed over the connector and wherein power, ground and slower speed signals are routed over the first set of electrical contacts.

23. The package assembly as recited in claim 22 wherein the first set of electrical contacts and the connector are mounted on opposite surfaces of the integrated circuit package.

24. The package assembly as recited in claim 22 wherein the first set of electrical contacts couple to the printed circuit board through a socket.

25. A package assembly including an integrated circuit package for an integrated circuit die, comprising:
    a first set of electrical contacts for coupling to a printed circuit board;
    a connector disposed on a surface of the package for coupling to a mating connector on another integrated circuit package; and
    wherein the first act of electrical contacts and the connector are mounted on a bottom source of the integrated circuit package.

26. An apparatus comprising:
a first integrated circuit mounted in a first package, the first package having a first set of electrical contacts and a first connector;
a second integrated circuit mounted in a second package, the second package having a second set of electrical contacts and a second connector, the second connector being electrically and physically coupled to the first connector, the first and second connectors being mating connectors, and
wherein the first set of electrical contacts is for coupling to a printed circuit board; and
wherein the first set of electrical contacts and the first connector are mounted on a bottom surface of the integrated circuit package.

* * * * *

UNITED STATES PATENT AND TRADEMARK OFFICE
CERTIFICATE OF CORRECTION

PATENT NO. : 6,707,684 B1
DATED : March 16, 2004
INVENTOR(S) : Anthony M. Andric, Ruel Hill and Doug Markwardt It is certified that error appears in the above-identified patent and that said Letters Patent is hereby corrected as shown below:

Column 6,
Line 23, replace "arm" with -- are --
Line 65, replace "act" with -- set --
Line 66, replace "source" with -- surface --

Column 8,
Line 7, replace "integrated circuit" with -- first --

Signed and Sealed this

Twelfth Day of April, 2005

JON W. DUDAS
*Director of the United States Patent and Trademark Office*